SYNCHRONOUS ANTICOINCIDENCE GATE
Filed June 19, 1968 3 Sheets-Sheet 1
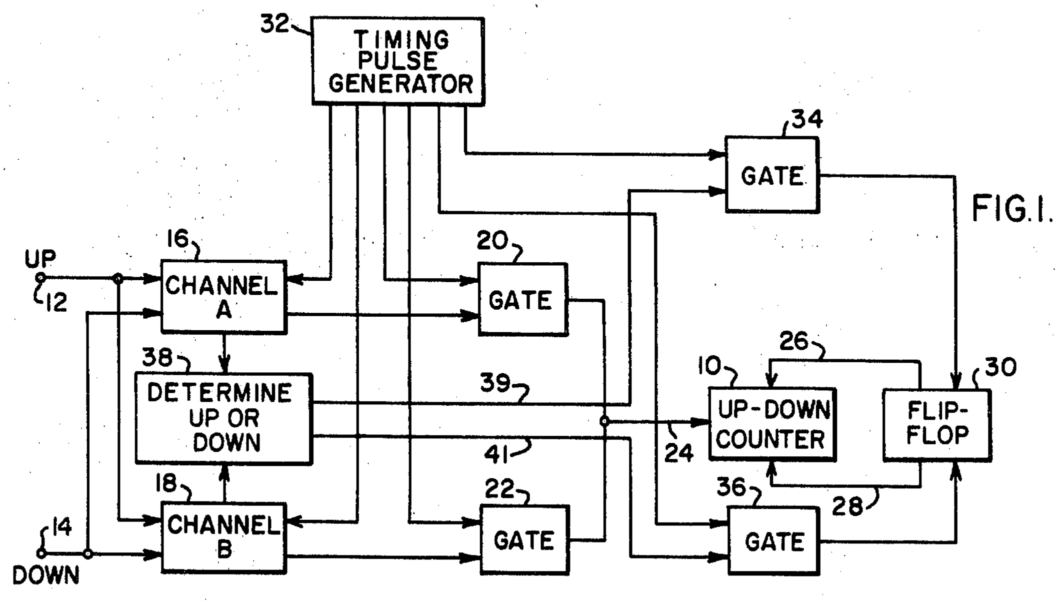
FIG. 1.
| | | | |
|---|---|---|---|
| CHANNEL A | RECEIVES PULSE | DELIVERS PULSE | RECEIVES PULSE |
| CHANNEL B | | RECEIVES PULSE | DELIVERS PULSE |
| | TIME PERIOD I | TIME PERIOD II | TIME PERIOD I |
FIG. 2.
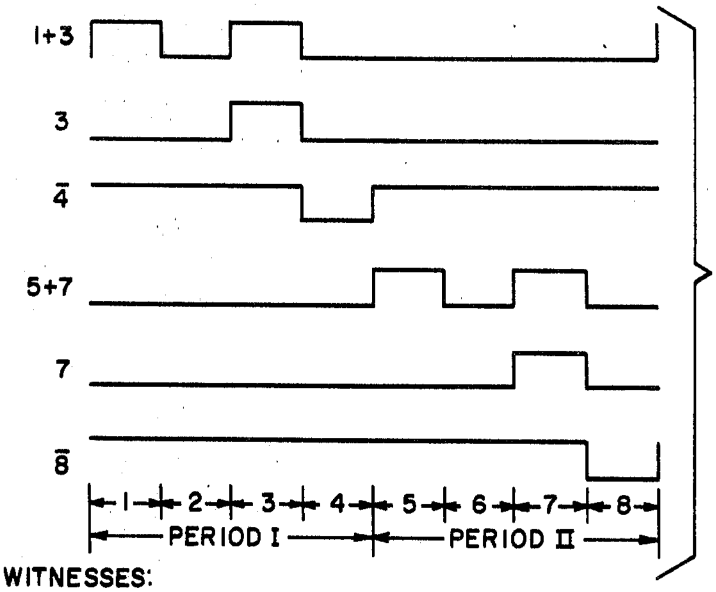
FIG. 4.
WITNESSES:
Bernard R. Giegucy
Leon M. Garman
INVENTOR
Francis T. Thompson
BY F.J. Brodahl
ATTORNEY United States Patent Office 3,560,859
Patented Feb. 2, 1971

3,560,859
SYNCHRONOUS ANTICOINCIDENCE GATE

Francis T. Thompson, Murrysville, Pa., assignor to Westinghouse Electric Corporation, Pittsburgh, Pa., a corporation of Pennsylvania Filed June 19, 1968, Ser. No. 738,236
Int. Cl. H03k *21/06*
U.S. Cl. 328—44 10 Claims

ABSTRACT OF THE DISCLOSURE

Described is an anticoincidence gate for application with up-down counters and the like and which cancels overlapping input signals of opposite direction (i.e., up and down count pulses occurring at the same time). This is accomplished by the use of two channels employing NAND logic elements, one of said channels acting to receive and store a pulse while the other feeds a pulse to the counter or other device and vice versa.

BACKGROUND OF THE INVENTION

In many applications where opposite actions in response to signals must be taken simultaneously, an anticoincidence gate is required. Its function is to separate in time or cancel two signals which are received at the same time. A good illustration of this problem is the reversible counter which cannot operate reliably if up and down pulses are received at the same time. In applications where up and down pulses may occur simultaneously, such as position tracking, control or addition-subtraction, an anticoincidence gate is desirable to drive the counter. This gate cancels or spaces in time overlapping input signals of opposite direction. Such a gate should work under all kinds of input conditions without decreasing the maximum frequency rate.

In the past, various types of anticoincidence gates have been provided; however they usually present race conditions, do not operate reliably under all input conditions, or have a very low frequency response. This last point becomes important in many modern control systems where a high pulse rate is registered on the two input lines.

SUMMARY OF THE INVENTION

As an overall object, the present invention seeks to provide a new and improved synchronous anticoincidence gate for up-down counters and the like which eliminates the disadvantages of prior art anticoincidence gates of this type.

More specifically, an object of the invention is to provide a synchronous anticoincidence gate formed from integrated circuit, solid-state NAND logic elements wherein race conditions are eliminated, high speed response is achieved by using synchronous logic and by dividing the period of the circuit into two sequences, and wherein the tolerance of the input pulse width is not severe.

In accordance with the invention, two symmetrical detecting channels are provided, each of which will accept up and down pulses. The basic idea is to divide the period of the circuit into two sequences, one sequence being used for detection and the other for information transfer. This principle has the advantage of increasing the speed of the circuitry since, during an information transfer sequence, a new pulse of either direction can be registered. For high speed and simplicity reasons, the anticoincidence gate of the invention either cancels simultaneous pulses or delays the second pulse received, depending upon the relative position in time of the two pulses. As will be seen, two practical embodiments of the invention are shown herein, one being for counters with a clock input and an up-down bus and the other for counters with up and down inputs.

The above and other objects and features of the invention will become apparent from the following detailed description taken in connection with the accompanying drawings which form a part of this specification, and in which:

FIG. 1 is a simplified block diagram of the anticoincidence gate of the invention as applied to an up-down counter employing an up-down bus with a clock input;

FIG. 2 is a table illustrating the time sequence of the circuit of FIG. 1;

Figure 3:
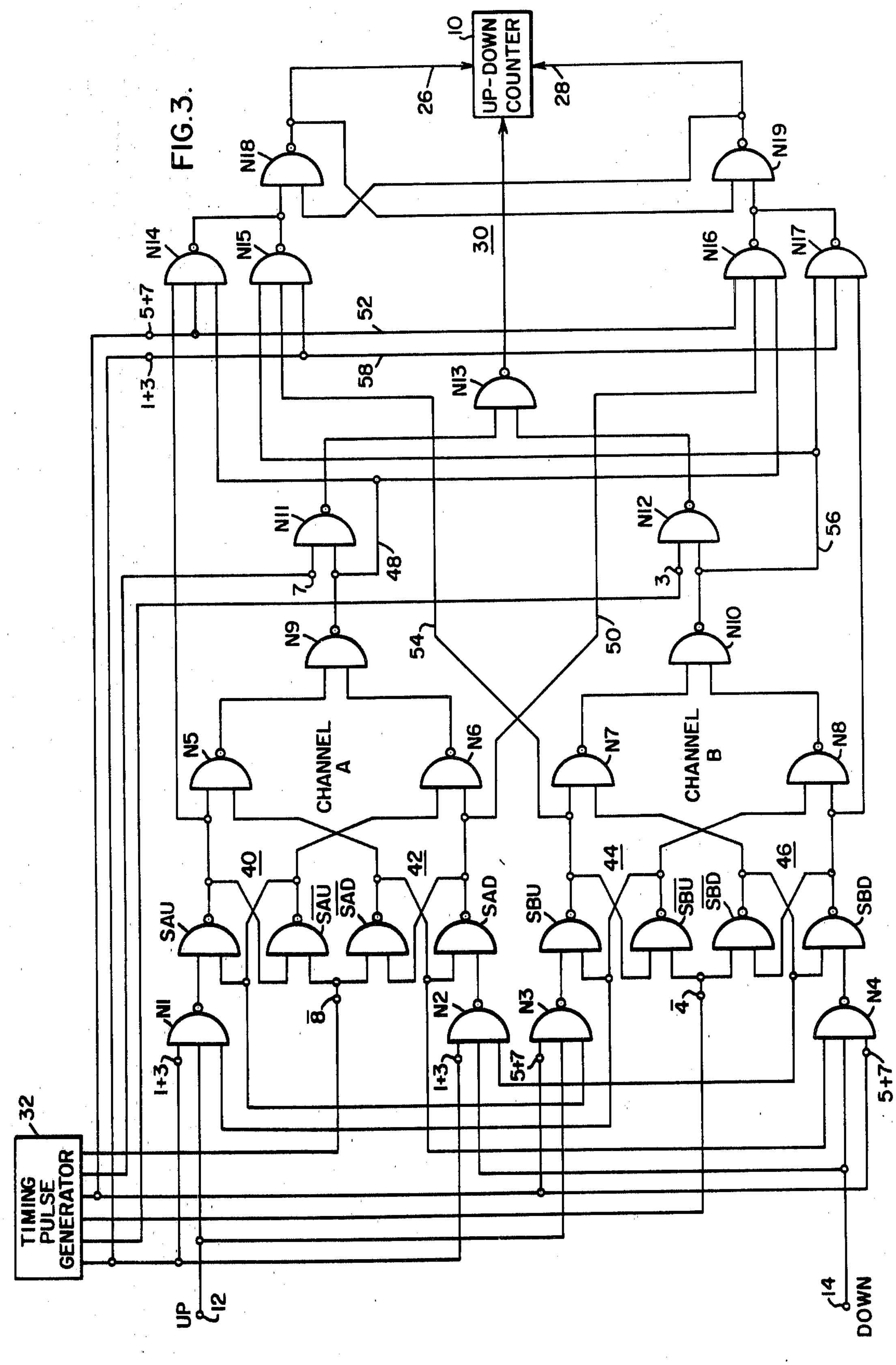
FIG. 3 is a detailed schematic circuit diagram of an anticoincidence gate as applied to an up-down counter employing an up-down bus.
Figure 5:
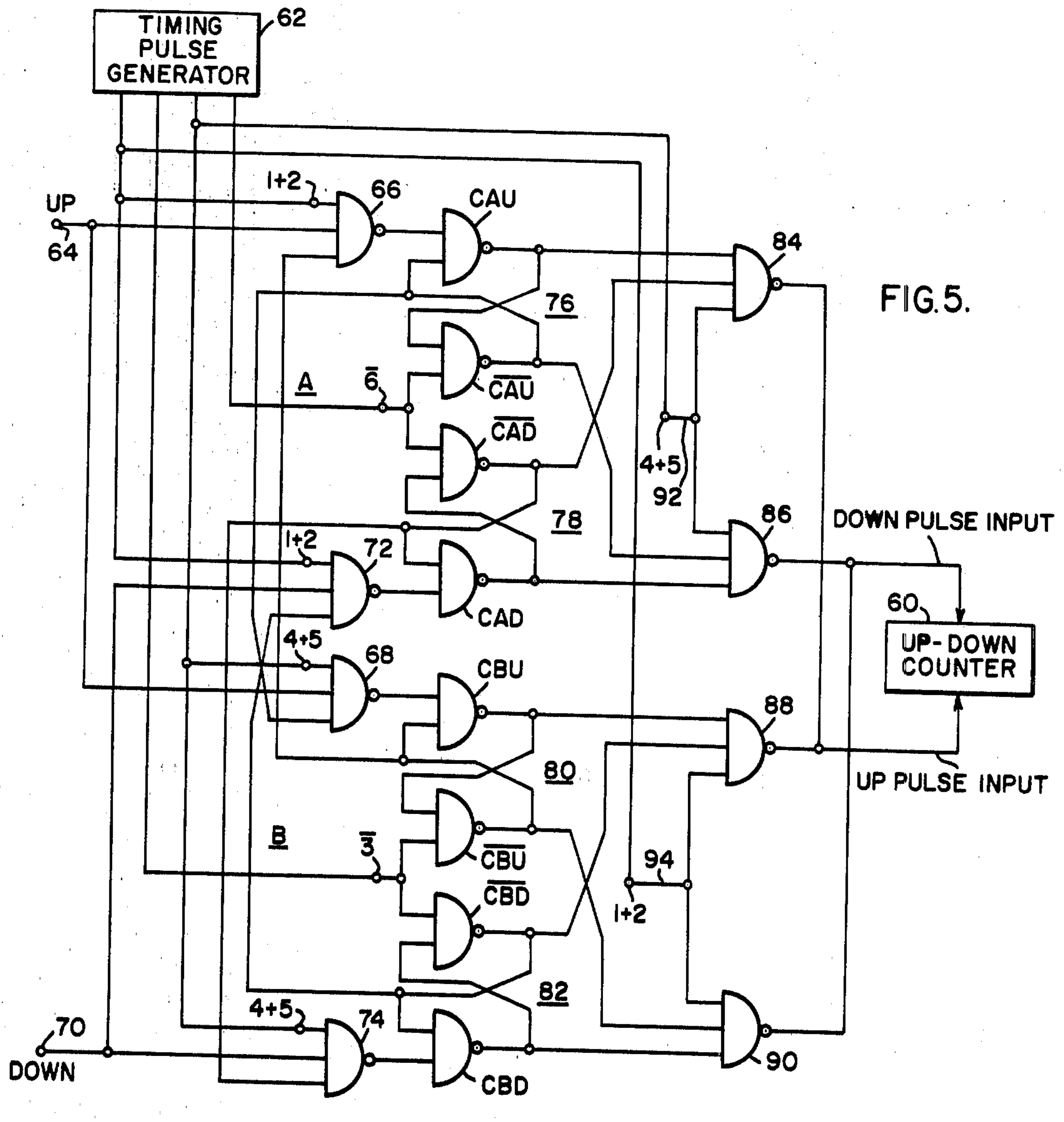
Figure 6:
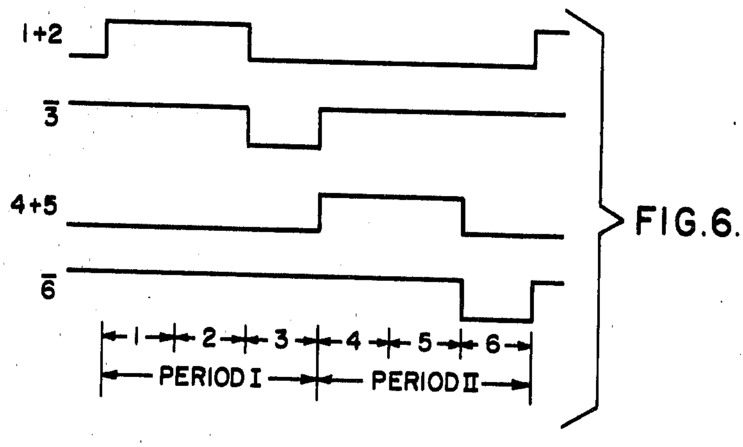

FIG. 4 comprises waveforms illustrating the timing pulses applied to the circuit of FIG. 3;

FIG. 5 is a schematic circuit diagram of another embodiment of the invention as applied to a counter having both up and down inputs; and FIG. 6 comprises waveforms illustrating the timing pulses applied to the circuit of FIG. 5.

With reference now to the drawings, and particularly to FIG. 1, up pulses for an up-down counter 10 are applied to input terminal 12, while down pulses are applied to input terminal 14. As can be seen, the input terminals 12 and 14 are both connected to a channel A, identified by the reference numeral 16, and both inputs are also applied to a channel B, identified by the reference numeral 18. The output of channel 16 is fed to a gate 20. In a similar manner, the output of channel 18 is fed to a gate 22; while the outputs of the two gates 20 and 22 are fed to the clock input 24 of the up-down counter 10.

As will be understood, the counter 10 is of the type wherein pulses to be counted are applied to the clock input 24, regardless of whether the counter should count up or count down. Whether the counter counts up or down is dependent upon signals on up, down buses 26 and 28, respectively. The state of the signals on buses 26 and 28, in turn, is dependent upon the state of a flip-flop circuit 30. In one state of the flip-flop 30, the bus 26 will be energized to cause the counter 10 to count up; whereas in the other state of the flip-flop 30, bus 28 will be energized to cause the counter to count down. The progression of pulses through the circuitry is controlled by means of a timing pulse generator 32 having outputs connected to channels 16 and 18, gates 20 and 22 and gates 34 and 36, these latter gates controlling the state of the flip-flop 30 and, hence the direction in which the counter 10 will count.

Let us assume, for example, that up and down pulses are received on terminals 12 and 14 at the same time. Under these circumstances, the two pulses will be canceled in either channel A or channel B, and no information will pass to the counter 10. However, the result is the same as it would be if both of the pulses had passed to the counter and registered correctly since the down pulse would cancel the effect of the up pulse. On the other hand, let us assume that an up pulse is received on terminal 12 at a time when no down pulse is received on terminal 14. With reference to FIG. 2, it will be seen that the operation of the circuit is divided into two time sequences or periods which continually repeat. During time period I, channel A is enabled to receive pulses; whereas, during time period II, channel B is enabled to receive pulses. However, pulses cannot be received by both channels at the same time. In a given application the total period, which is equal to the sum of period I and period II, must be selected equal to or less than the minimum period between successive pulses of the same type, i.e. successive up pulses or successive down pulses.

Let us assume, as shown in FIG. 2, that during time period I, an up pulse is received by channel A. The channel A not only receives and stores the pulse but also, through circuitry 38 hereinafter described in detail, determines whether the pulse is an up pulse or a down pulse. Since the pulse in this case is an up pulse, the circuitry 38 will, through lead 39, apply an enabling signal to gate 34. However, gate 34 is not opened or enabled during the first time period I by the timing pulse generator 32. Hence, during the first time period, the pulse is stored in channel A, and it is determined whether the pulse is an up pulse or a down pulse.

During the second time period II, a gate pulse is applied to the gate 34, thereby causing the flip-flop 30 to energize the up bus 26. Following this, the timing pulse generator 32 enables gate 20, and the up pulse stored in channel A is passed to the clock input 24, thereby causing the counter 10 to count up. At the same time (i.e., time period II), the channel B is enabled by the timing pulse generator 32 to receive a pulse which may be either an up pulse or a down pulse subject to the condition that two successive pulses of the same type cannot occur in a period of less than the sum of time period I and time period II. As an example, it will be assumed that during time period II, a down pulse is received and stored in channel B and that the circuitry 38 applies an enabling signal to the gate 36 via lead 41. The gate 36, however, is not opened or enabled during time period II by the timing pulse generator 32; and the down pulse is stored in channel B since gate 22 is not opened during time period II. During time period II, the following things happen:

(1) The flip-flop 30 is first triggered by the output of gate 34 to energize the up bus 26.

(2) Gate 20 is thereafter enabled by the timing pulse generator 32 to pass the stored up pulse from channel A to the counter 10, thereby causing the counter to count up one.

(3) A down pulse is received by channel B and stored therein.

(4) Circuitry 38 applies an enabling signal to the gate 36.

After time period II, time period I repeats itself, and channel A is now conditioned to receive an additional pulse which may be either an up pulse or a down pulse subject to the minimum period between successive like pulses. At the same time, during the new time period I, gate 36 is enabled by timing pulse generator 32; flip-flop 30 energizes the down bus 28, and gate 22 is enabled to pass the down pulse stored in channel B to the counter 10, thereby causing it to count down one. As will be appreciated, the time periods I and II continue to repeat, the pulses being stored in channel A or B during one time period and thereafter delivered to the up-down counter during the next succeeding time period.

One practical embodiment of the circuit schematically illustrated in FIG. 1 is shown in detail in FIG. 3, the outputs of the timing pulse generator 32 being shown by the waveforms of FIG. 4. As can be seen, period I is divided into four phases numbered 1–4; and, similarly, period II is divided into four phases numbered 5–8. There are six output leads from the timing pulse generator, the first lead identified as 1+3 producing the first waveform shown in FIG. 4. Note that positive pulses are produced in waveform 1+3 during the phases 1 and 3 of period I. The second output lead from the timing pulse generator produces the second waveform in FIG. 4 wherein a single positive pulse is produced during phase 3; and the lead $\overline{4}$ produces the third waveform on FIG. 4 wherein a positive output is present except during the fourth phase when the output is zero.

During period II, the fourth waveform in FIG. 4 is produced on lead 5+7 wherein positive pulses are produced during phases 5 and 7. Finally, the fifth and sixth waveforms in FIG. 4 are produced on the fifth and sixth output leads from the timing pulse generator 32. One of these, identified by the numeral 7, produces a positive pulse during phase 7 of period II and the last waveform identified by the numeral $\overline{8}$ produces a positive output except during the eighth phase of period II when a zero output is produced.

As was explained above, the two channels A and B alternately detect the input pulses. In channel A, pulses are detected during phases 1 and 3 shown in FIG. 4 and transferred to the counter during phases 5 and 7. In channel B, pulses are detected during phases 5 and 7 and transferred to the counter during phases 1 and 3. If both up and down pulses are detected in channel A, during a given 1 through 3 period, they are canceled. Similar cancellation occurs for up and down pulses in channel B during a 5 through 7 period. If an up pulse is detected in one channel and a down pulse is detected in the other channel, the pulses are delayed to provide adequate time between pulses to permit the counter to count them correctly. The width of up or down input pulses to the anticoincidence circuit must be greater than one timing phase period (i.e., period 5 or 7) plus the time to set a detection flip-flop, but less than five timing phase periods.

The circuit of FIG. 3 employs NAND circuits which are essentially AND circuits having coupled to their outputs an inverter. Thus, if it is assumed that "1" or positive signals are required on all the input leads to the NAND circuit to produce an output, the output will appear as a "0" or negative signal. As shown in FIG. 3, channel A includes two flip-flop circuits 40 and 42. Similarly, channel B includes two flip-flop circuits 44 and 46. Flip-flop circuit 40 comprises two interconnected NAND elements SAU and $\overline{SAU}$; while flip-flop circuit 42 includes two interconnected NAND elements $\overline{SAD}$ and SAD. Similarly, flip-flop 44 in channel B includes two NAND elements SBU and $\overline{SBU}$; while flip-flop 46 includes two interconnected NAND elements $\overline{SBD}$ and SBD.

Up pulses on input terminal 12 are applied to NAND element N1 along with phases 1+3 shown in FIG. 4 and the output of NAND element $\overline{SBU}$ of flip-flop 44. As will be seen, the input from NAND element $\overline{SBU}$ is a "1" except when flip-flop 44 is set. This prevents flip-flop 40 from being set when flip-flop 44 is set. Stated in other words, the interconnection between the flip-flops acts to insure against an up pulse being stored in both channels. At the same time, up pulses on terminal 12 are applied to NAND element N3 along with phases 5+7 and the output of NAND element $\overline{SAU}$ of flip-flop 40. Down pulses on input terminal 14 are applied to NAND element N4 along with phases 5+7 and the output of NAND element $\overline{SAD}$ in flip-flop 42. Likewise, down pulses are applied to NAND element N2 along with phases 1+3 and the output of NAND element $\overline{SBD}$ in flip-flop 46.

The outputs of NAND elements SAU and $\overline{SAD}$ are applied to NAND element N5; while the outputs of NAND elements $\overline{SAU}$ and SAD are applied to NAND element N6. The outputs of NAND elements N5 and N6, in turn, are applied through NAND element N9 and NAND gate N11 to NAND gate N13. Similar elements identified as N7, N8, N10 and N12 are provided for channel B. The output of NAND gate N13 is applied as a clock pulse to the up-down counter 10.

The manner in which simultaneous up and down pulses are canceled will now be described. An up pulse, detected during phases 1 or 3 produces a "0" output from NAND element N1 and a "1" output from NAND element SAU. A down pulse detected during these same phases 1 or 3 produces a "0" output from NAND element N2 and a "1" output from NAND element SAD of flip-flop 42. The outputs from NAND elements $\overline{SAU}$ and $\overline{SAD}$, however, are "0." Consequently, these signals when applied to NAND elements N5 and N6 give "1" outputs which, in turn, produce a "0" output at NAND element N9 and disable gate N11. Under these circumstances, gate N11 cannot pass the phase 7 pulse from timing pulse generator 32 to gate N13 and no pulse is fed to the counter 10.

The same result occurs if up and down pulses are detected during phases 5 or 7 in channel B. That is, the output of NAND element N10 will be "0" and the phase 3 pulse from timing pulse generator 32 cannot pass through NAND gate N12 to gate N13.

Let us assume, now, that a down pulse on input terminal 14 is detected during phase 1 or 3. This produces a "0" output from NAND element N2 which, in turn, sets NAND element SAD of flip-flop 42 whereby it gives "1" output. The output of NAND element $\overline{SAU}$ of flip-flop 40 is also "1." This gives a "0" output from NAND element N6 and a "1" output from NAND element N9. This "1" output from NAND gate N9 is applied via lead 48 to NAND elements N14 and N16. At the same time, the "1" output of NAND element SAD of flip-flop 42 on lead 50 is applied to NAND gate N16. Also applied to NAND gate N16 is the 5+7 phase on lead 52. This produces a "0" output from NAND gate N16 and sets NAND element N19 of the flip-flop 30, thereby energizing the down bus 28. To provide enough time for this transition (i.e., energization of down bus 28), the signal at the output of NAND gate N9 is not passed through NAND gate N11 until the seventh phase is reached during time period II. At this time, however, the pulse illustrated as the fifth waveform in FIG. 4 passes through gate N11 and produces at the output of gate N13 a "1" signal which is applied as a pulse to the counter 10.

While the foregoing is occurring, let us assume that an up pulse on terminal 12 is detected during phases 5 or 7. This sets NAND gate SBU of flip-flop 44 whereby the output of NAND gate SBU is "1," the output of NAND gate N7 is "0" and the output of NAND gate N10 is "1." The production of "1" signals on leads 54 and 56 enables NAND gate N15 when a phase 1 or 3 signal is also applied thereto via lead 58. By this time, we have passed through a time period I, a time period II, and are now in a succeeding time period I. Consequently, in phase 1 during the succeeding time period I NAND gate N18 of flip-flop 30 is set and the up bus 26 is energized. Now, when the third phase occurs in the succeeding period I, a pulse passes through NAND gate N12 and NAND gate N13 to the counter 10. Flip-flops 40 and 42 are reset during the eighth phase of period II; whereas flip-flops 44 and 46 are reset during the fourth phase of time period I by application of the third and sixth waveforms of FIG. 4 to NAND elements $\overline{SBU}$, $\overline{SBD}$ and $\overline{SAU}$, $\overline{SAD}$, respectively.

If an up pulse, rather than a down pulse, is detected during phases 1+3, flip-flop 40, gate N5 and gate N14 come into play rather than gate N15. However, the clock pulses are still fed to the counter through gates N9 and N13. In a similar manner, if a down pulse rather than an up pulse is detected during phases 5 and 7, flip-flop 46, gate N8 and gate N17 come into play, the clock pulses again being fed through gates N10 and N13. In this respect, it can be seen that the flip-flops 40 and 42 in channel A as well as the gates N14 and N15 operate in parallel, depending upon whether an up pulse or a down pulse is received during phases 1+3. Similarly, flip-flops 44 and 46 and gates N16 and N17 operate in parallel, depending upon whether an up or down pulse is received during phases 5+7.

From the foregoing, it can be seen that pulses are stored in one channel while they are fed to the counter through the other channel, the counter being conditioned for up or down counting prior to receipt of a clock pulse from gate N13.

With reference now to FIGS. 5 and 6, an anticoincidence gate and its associated waveforms for an up-down input type counter are shown. The circuit of FIG. 5 is similar to the gate shown in FIG. 3 but much simpler in construction and operation. The counter in this case is of the type which will receive up pulses on one input terminal and down pulses on the other. That is, up and down buses are not required, and the input pulses are not fed into the counter in the form of clock pulses.

The system of FIG. 5 again includes a timing pulse generator 62 which, in this case, has four output signals illustrated as the waveforms of FIG. 6. Time period I is divided into three phases 1 through 3, while time period II is divided into three phase numbers 4 through 6. The output of the timing pulse generator comprises a first phase or waveform 1+2 in which positive pulses are produced during phases 1 and 2. The generator 62 produces a waveform which is positive except during period 3 when a zero output is produced. The generator 62 also produces a waveform in which a positive pulse is produced during phases 4 and 5. Finally, a waveform is produced which is positive except during period 6.

Up pulses are applied to input terminal 64 and applied to the inputs of NAND elements 66 and 68. Similarly, down pulses are applied to input terminal 70 and fed to NAND elements 72 and 74. The 1+2 phase signal is applied to NAND elements 66 and 72 in channel A and, consequently, these elements are enabled only during phases 1 and 2. Likewise, the 4+5 phase signal is applied to the inputs of NAND elements 68 and 74 in channel B such that these elements are enabled only during phases 4 and 5 of period II. The output of NAND element 66 is applied to flip-flop circuit 76 consisting of interconnected NAND elements CAU and $\overline{CAU}$; whereas the output of NAND element 72 is applied to flip-flop circuit 78 comprising NAND elements $\overline{CAD}$ and CAD. In a similar manner, the output of NAND element 68 in channel B is applied to a flip-flop 80 comprising interconnected NAND elements CBU and $\overline{CBU}$, while the output of NAND element 74 is applied to flip-flop 82 comprising interconnected NAND elements $\overline{CBD}$ and CBD.

Pulse cancellation upon receipt of simultaneous up and down pulses occurs in the same manner as it did in the embodiment of FIG. 3. That is, if up and down pulses are received simultaneously during phases 1+2, NAND elements 66 and 72 both produce "0" outputs; NAND elements $\overline{CAU}$ and $\overline{CAD}$ also produce "0" output signals, and the NAND gates 84 and 86 are disabled and cannot apply pulses to the counter 60. The same action occurs when simultaneous up and down pulses are received during phases 4 and 5. That is, the outputs of NAND elements $\overline{CBU}$ and $\overline{CBD}$ in flip-flops 80 and 82 are "0" and disable NAND gates 88 and 90.

However, if an up pulse is received alone during phases 1+2, the following things happen: The output of NAND element 66 is "0"; the output of NAND element CAU in flip-flop 76 is "1" and the output of NAND element $\overline{CAD}$ in flip-flop 78 is "1." Consequently, during phases 4 and 5 when a pulse is applied to terminal 92, the NAND gate 84 is enabled to pass the up pulse to counter 60. This, of course, occurs during period II; and if an up or down pulse is received during this same period II, it is stored in flip-flop 80 or 82 and thereafter passed to the counter 60 through gate 88 or 90 during phases 1+2 applied to terminal 94 during the succeeding period I. The counters 76 and 78 are reset by phase $\overline{6}$ after the output pulses have passed to the counter during phases 4 and 5 in period II; whereas the flip-flops 80 and 82 are reset by phase $\overline{3}$ after pulses from channel B are fed to counter 60 during phases 1 and 2 of period I. In a given application the sum of period I and period II must be selected equal to or less than the minimum period between successive pulses of the same type.

It will be appreciated that the timing pulse generators 32 and 62 shown herein may take various forms; however they preferably comprise ring counters, the outputs of which are applied through appropriate logic circuitry to derive the waveforms shown in FIGS. 4 and 6. All of this is well within the skill of the art.

Although the invention has been shown in connection with certain specific embodiments, it will be readily apparent to those skilled in the art that various changes in form and arrangement of parts may be made to suit requirements without departing from the spirit and scope of the invention.

I claim as my invention:

1. Synchronous anticoincidence gate means comprising first and second input terminals to which input pulses are applied, a first signal channel, a second signal channel, means connecting said first and second input terminals and the pulses applied thereto to the inputs of both of said channels, means for enabling said first channel to receive input pulses during a first time period, means for enabling said second channel to receive input pulses during a second time period, means in each of said channels for canceling simultaneous input signals received thereby during the time period that it is enabled, means in each of said channels for storing a single pulse received thereby during the time period that it is enabled, and means in each of said channels for producing an output pulse corresponding to the pulse it has stored during the next succeeding time period when the other of said channels is enabled to receive and store a single pulse.

2. The gate means of claim 1 including an up-down counter coupled to the outputs of said channels, and wherein up-count pulses are applied to one of said input terminals and down-count pulses are applied to the other of said input terminals.

3. The gate means of claim 2 wherein the up-down counter has a first input terminal adapted to receive a succession of up-count pulses and a second input terminal adapted to receive a succession of down-count pulses.

4. The gate means of claim 2 wherein the up-down counter is of the type having an up-pulse input and a down-pulse input, the pulses to be counted being fed to a clock pulse input to the counter and the direction in which the counter counts being determined by the states of said down-pulse and up-pulse inputs.

5. The gate means of claim 4 including means in each of said channels for energizing said up-pulse or down-pulse inputs depending upon whether an up-pulse or a down-pulse is stored in said channel.

6. The gate means of claim 1 wherein said channels are formed from NAND solid-state circuit elements.

7. The gate means of claim 1 wherein each of said channels includes a pair of flip-flop circuits one of which is set by an up-count pulse and the other of which is set by a down-count pulse.

8. The gate means of claim 7 wherein the outputs of said flip-flops are applied to gates which are enabled during the time period succeeding that time period during which input pulses are received by that channel.

9. The gate means of claim 4 including flip-flop means coupled to said channels for changing the states of said up-pulse and down-pulse inputs.

10. The gate means of claim 1 wherein said means for enabling said first and second channels includes a timing pulse generator having a plurality of output leads connected to the respective channels, the pulses on the leads connected to the first channel occuring during a first time period and the pulses on the leads connected to the second channel occurring during a succeeding time period.

References Cited

UNITED STATES PATENTS

| | | | |
|---|---|---|---|
| 2,867,724 | 1/1959 | Olson | 328—44X |
| 3,192,478 | 6/1965 | Metz | 328—44 |
| 3,310,749 | 3/1967 | Clark | 328—37X |
| 3,348,069 | 10/1967 | Petschauer | 328—37X |
| 3,462,613 | 8/1969 | Wolf | 328—37X |

JOHN S. HEYMAN, Primary Examiner

U.S. Cl. X.R.

328—72, 97; 307—215